(12) United States Patent
Boyd et al.

(10) Patent No.: US 11,746,419 B2
(45) Date of Patent: Sep. 5, 2023

(54) SHIELD PLATE FOR A CVD REACTOR

(71) Applicant: AIXTRON SE, Herzogenrath (DE)

(72) Inventors: Adam Boyd, Kelmis (BE); Wilhelm Josef Thomas Krücken, Aachen (DE); Honggen Jiang, Cornwall (GB); Fred Michael Andrew Crawley, Hertfordshire (GB)

(73) Assignee: AIXTRON SE, Herzogenrath (DE)

( * ) Notice: Subject to any disclaimer, the term of this patent is extended or adjusted under 35 U.S.C. 154(b) by 0 days.

(21) Appl. No.: 17/309,108

(22) PCT Filed: Oct. 22, 2019

(86) PCT No.: PCT/EP2019/078738
§ 371 (c)(1),
(2) Date: Apr. 23, 2021

(87) PCT Pub. No.: WO2020/083917
PCT Pub. Date: Apr. 30, 2020

(65) Prior Publication Data
US 2022/0002872 A1    Jan. 6, 2022

(30) Foreign Application Priority Data
Oct. 25, 2018   (DE) .................... 10 2018 126 617.0

(51) Int. Cl.
    *C23C 16/455*    (2006.01)
    *H01J 37/32*     (2006.01)

(52) U.S. Cl.
    CPC .... *C23C 16/45565* (2013.01); *C23C 16/4557* (2013.01); *C23C 16/45572* (2013.01);
    (Continued)

(58) Field of Classification Search
    CPC ............ H01J 37/3244; H01J 37/32449; H01J 2237/3321; H01J 37/32091; C23C 16/45565; C23C 16/4557; C23C 16/45572
    See application file for complete search history.

(56) References Cited

U.S. PATENT DOCUMENTS

| 6,793,733 B2 | 9/2004 | Janakiraman et al. |
| 9,587,312 B2 | 3/2017 | Silva et al. |
| (Continued) | | |

FOREIGN PATENT DOCUMENTS

| DE | 10 2012 110 125 A1 | 4/2014 |
| JP | H09213689 A * | 8/1997 |
| (Continued) | | |

OTHER PUBLICATIONS

Machine translation of JP 2010-232402. (Year: 2010).*
(Continued)

*Primary Examiner* — Jeffrie R Lund
(74) *Attorney, Agent, or Firm* — ASCENDA LAW GROUP, PC

(57) ABSTRACT

A CVD reactor includes a gas inlet member having a circular outline, and a susceptor that can be heated by a heating device. The gas inlet member has a cooled ceiling panel with outlet openings. The CVD reactor further comprises a shield plate, which adjoins the ceiling panel and has a circular outline. The shield plate has a central zone, an annular zone surrounding the central zone, having a rear side that points toward the ceiling panel, and a flat gas outlet surface pointing toward the process chamber, in which gas outlet openings terminate. The rear side in the central zone defines a rear plane running parallel to the gas outlet surface. The shield plate has a material thickness between 3 to 12 mm, (Continued)

US 11,746,419 B2

Page 2 and that the shield plate is spaced apart from the ceiling plate by a gap having a height between 0.3 to 1 mm.

6 Claims, 3 Drawing Sheets

(52) U.S. Cl.
CPC .... *H01J 37/3244* (2013.01); *H01J 37/32449* (2013.01); *H01J 2237/3321* (2013.01)

(56) References Cited

U.S. PATENT DOCUMENTS

| | | | |
|---|---|---|---|
| 2005/0011447 | A1 | 1/2005 | Fink |
| 2007/0022954 | A1* | 2/2007 | Iizuka ............... C23C 16/45565 118/724 |
| 2007/0266944 | A1* | 11/2007 | Iizuka ................ C23C 16/4486 118/722 |
| 2009/0061646 | A1* | 3/2009 | Chiang ............. C23C 16/45548 257/E21.24 |
| 2010/0003824 | A1 | 1/2010 | Kadkhodayan et al. |
| 2011/0284100 | A1* | 11/2011 | Kudela ............ C23C 16/45565 137/343 |
| 2015/0179405 | A1 | 6/2015 | Saito |
| 2017/0243724 | A1* | 8/2017 | Noorbakhsh ..... H01J 37/32449 |
| 2022/0002872 | A1* | 1/2022 | Boyd ................. C23C 16/4557 |

FOREIGN PATENT DOCUMENTS

| | | | | |
|---|---|---|---|---|
| JP | 2008031558 | A * | 2/2008 | ....... C23C 16/45514 |
| JP | 2010-232402 | A | 10/2010 | |
| JP | 2023033356 | A * | 3/2023 | ......... C23C 16/4412 |
| KR | 100715079 | B1 * | 5/1997 | |
| KR | 20080112437 | A | 12/2008 | |
| KR | 101373746 | B1 | 3/2014 | |
| TW | 202118892 | A * | 5/2021 | ....... C23C 16/45565 |
| WO | 2011/004712 | A1 | 1/2011 | |
| WO | WO-2021160835 | A1 * | 8/2021 | |

OTHER PUBLICATIONS

International Preliminary Report on Patentability dated Apr. 27, 2021, from The International Bureau of WIPO, for International Patent Application No. PCT/EP2019/078738 (filed Oct. 22, 2019), 15 pgs.
Written Opinion dated Jan. 24, 2020, from ISA/European Patent Office, for International Patent Application No. PCT/EP2019/078738 (filed Oct. 22, 2019), English translation, 6 pgs.
International Search Report dated Jan. 24, 2020, from ISA/European Patent Office, for International Patent Application No. PCT/EP2019/078738 (filed Oct. 22, 2019), 6 pgs.
Written Opinion dated Jan. 24, 2020, from ISA/European Patent Office, for International Patent Application No. PCT/EP2019/078738 (filed Oct. 22, 2019), 7 pgs.

* cited by examiner

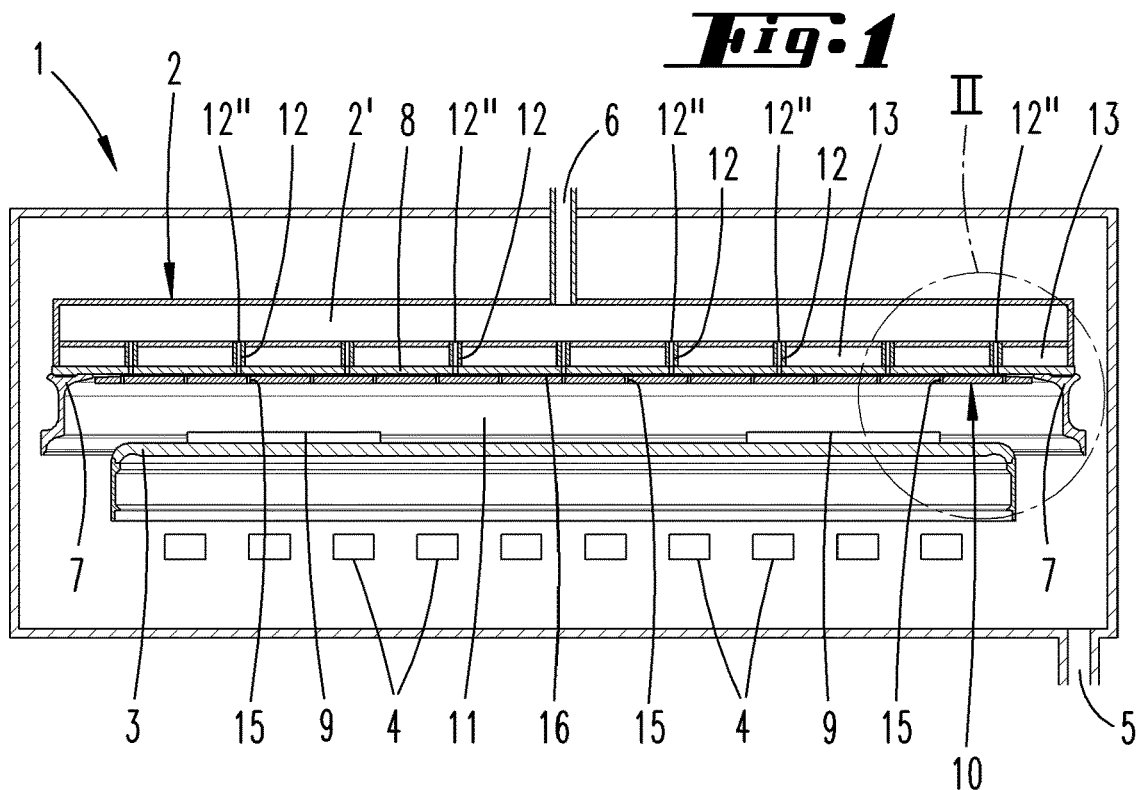
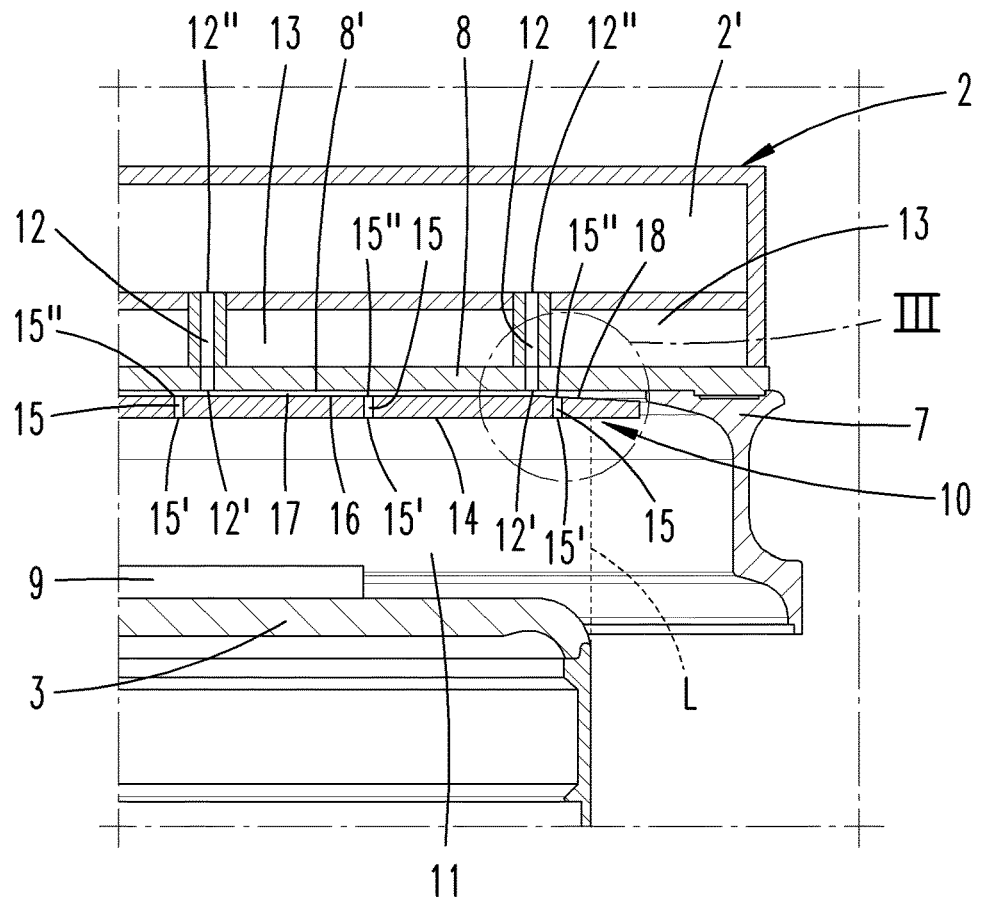

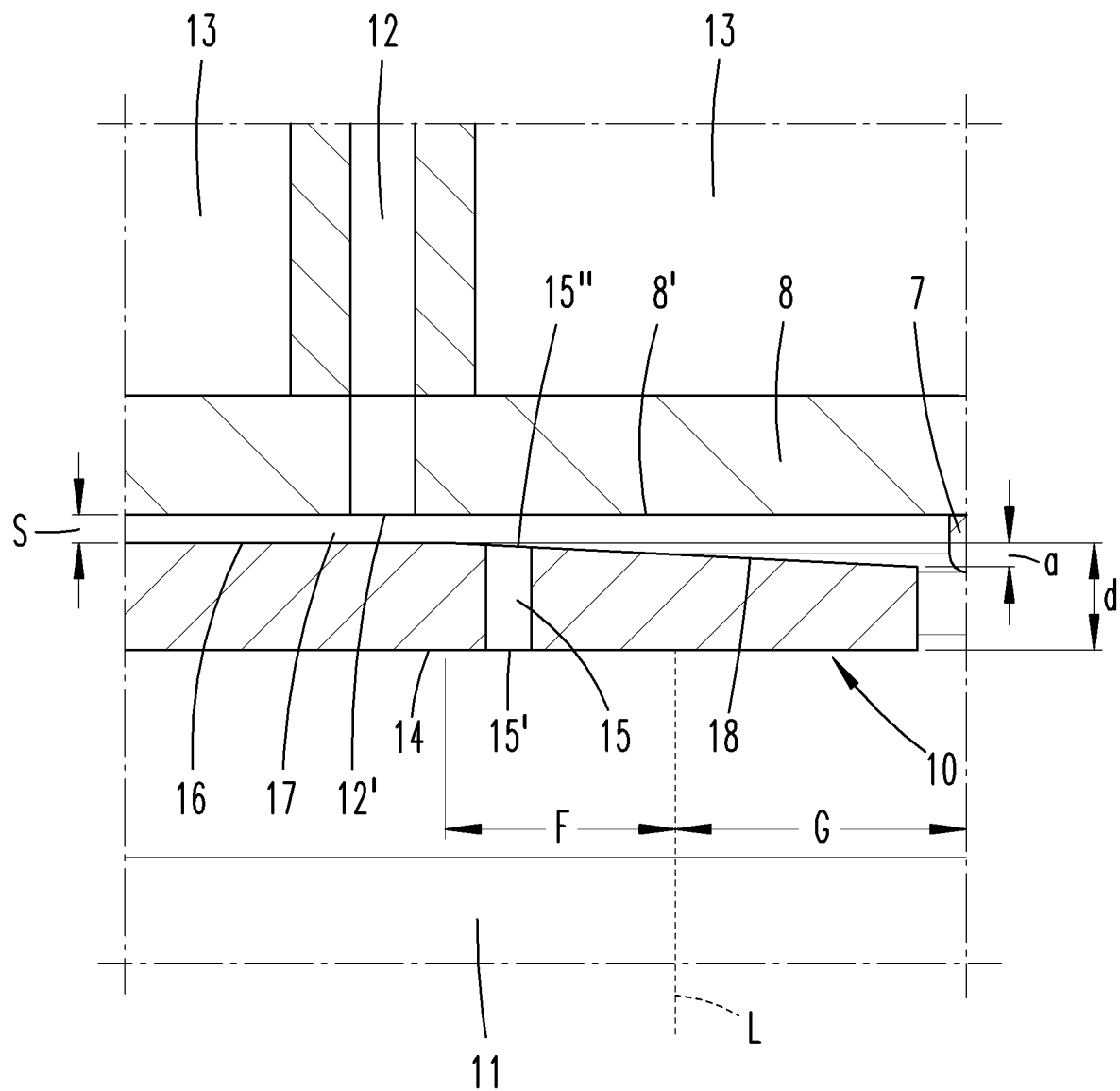

SHIELD PLATE FOR A CVD REACTOR

RELATED APPLICATIONS

This application is a National Stage under 35 USC 371 of and claims priority to International Application No. PCT/EP2019/078738, filed 22 Oct. 2019, which claims the priority benefit of DE Application No. 10 2018 126 617.0, filed 25 Oct. 2018.

FIELD OF THE INVENTION

The invention relates to a CVD reactor with a gas inlet member having a circular outline, which has a cooled ceiling panel facing towards a process chamber, and a susceptor that can be heated by a heating device, wherein the ceiling panel has outlet openings, and with a shield plate, adjacent to the ceiling panel, having a circular outline, which shield plate has a central zone, an annular zone surrounding the central zone, a rear face facing towards the ceiling panel, and a first, planar, gas outlet surface facing towards the process chamber, into which gas outlet openings lead, wherein the rear face in the central zone defines a rear plane extending parallel to the gas outlet surface, and wherein the rear face has structures for purposes of influencing the thermal coupling of the shield plate to the ceiling panel, and/or for purposes of influencing the heat flow through the shield plate, which structures form at least one elevation, and/or one depression, with respect to the rear plane.

The invention furthermore relates to a shield plate for use in a CVD reactor.

The invention furthermore relates to a method for purposes of influencing the temperature of a first gas outlet surface, facing towards a process chamber, of a shield plate, having a circular outline, arranged between a cooled ceiling panel of a CVD reactor, which shield plate has a central zone, an annular zone surrounding the central zone, a rear face facing towards the ceiling panel, and a first, planar, gas outlet surface facing towards the process chamber, into which gas outlet openings lead, wherein in its central zone the rear face defines a rear plane extending parallel to the gas outlet surface, and wherein a susceptor heated by a heating device carries at least one substrate, which is heat-treated, wherein a heat flow is generated from the susceptor to the ceiling panel, wherein the thermal coupling of the shield plate to the ceiling panel, and/or the heat flow through the shield plate, is influenced by means of structures arranged on the rear face of the shield plate, wherein the structures form at least one elevation, and/or one depression, with respect to the rear plane.

BACKGROUND

A generic device is described in DE 10 2012 110 125 A1. The CVD reactor there described, and the method there described, for the deposition of thin semiconductor layers on semiconductor substrates, has a gas inlet member, through which a process gas is fed into a process chamber. A shield plate, with gas passageways aligned with the gas outlet openings of the base plate, extends below a gas outlet surface of a base plate of the gas inlet member. The substrates to be coated lie on a heated substrate.

Devices of this type are also of known in the art from KR 101373746, U.S. Pat. No. 6,793,733 B2, and U.S. Pat. No. 9,587,312 B2.

Furthermore, in US 2010/0003824 A1, provision is made for a plate arranged below a gas outlet plate of a gas inlet member, which plate has a taper in the edge region.

In a device of the type cited in the introduction, or in a method of the type cited in the introduction, it is observed that a non-homogeneous lateral temperature profile forms on the underside of the shield plate, that is to say, on the gas outlet surface facing towards the process chamber and bounding the process chamber, from which the process gas flows into the process chamber. In a generic method, the susceptor carrying the substrates, which susceptor bounds the process chamber in the downward direction, is heated from below to a susceptor temperature of, for example, more than 1,000° C. The ceiling panel is actively cooled. As a consequence, a heat flow forms from the susceptor, through the process chamber, and through the shield plate, to the cooled ceiling panel. The temperature of the gas outlet surface of the shield plate facing towards the process chamber is essentially influenced by the local thermal radiation output of the susceptor surface, or the substrate surface. This can vary locally, such that the surface temperature of the shield plate can also vary locally.

However, for a uniform and stable coating process of the substrates with thin layers, in particular semiconductor layers, it is necessary that the surface of the shield plate facing towards the process chamber has the smallest possible local temperature differences.

JP 2010-232402 A describes a CVD reactor in which a further plate is arranged below a gas outlet plate of a gas inlet member, and is fixedly connected to the gas inlet member. The edge regions of the plate project radially, and have a wedge-shaped profile.

DE 10 2012110125 A1 shows a gas inlet member with a shield plate, which is spaced apart by a gap from a gas outlet surface of the gas inlet member.

SUMMARY OF THE INVENTION

The invention is thus based on the objective of providing means with which the temperature profile of a process chamber ceiling can be influenced locally.

The objective is achieved by the invention as specified in the claims, wherein the subordinate claims represent not only advantageous further developments of the invention indicated in the independent claims, but also autonomous achievements of the objective.

First and foremost, it is proposed that the shield plate has structures on its rear face, facing towards the ceiling panel, which are designed such that they influence a thermal coupling, and/or the heat flow through the shield plate, locally in different ways. The rear face of the ceiling panel can have zones that are adjacent to each other, and are thermally coupled to each other in different ways. However, the zones can also be designed such that the heat flow from the gas outlet surface to the rear face of the shield plate is different in zones that differ from each other. The structures can be used to influence the thermal coupling between the individual zones, or the thermal coupling of the shield plate to the ceiling panel. With such a shield plate design, the surface temperature of the process chamber ceiling formed by the gas outlet surface can thus be locally influenced so as to minimize lateral temperature gradients in the gas outlet surface caused by locally-differing thermal radiation outputs of the susceptor. In example embodiments of the inventions, provision can be made for the ceiling panel to be formed by a gas inlet member. The gas inlet member can comprise one or a plurality of gas distribution chambers, which are fed from the external environment by a gas supply line. The at least one gas distribution chamber arranged within the gas inlet member is connected to a second gas outlet surface by gas passageways. The second gas outlet surface is formed by the base plate. Provision can furthermore be made for a coolant accommodation chamber to be directly adjacent to the ceiling panel. However, provision can also be made for the ceiling panel to have cooling channels, or to be part of a heat sink. The gas passageways of the gas inlet member lead into the ceiling panel. A multiplicity of gas outlet openings, arranged in the manner of a screen, are provided in the ceiling panel, each of which is fed by a gas passage channel. Provision can furthermore be made for the shield plate to be spaced apart from the ceiling panel. Thus, in particular, a gap is provided between the rear face of the second gas outlet surface, which is formed by the ceiling panel, and the shield plate. This gap can have a maximum gap height of 20 mm. Provision is preferably made for the gap height to be at most 2 mm, and in particular to lie in a range between 0.3 and 1 mm. Provision can furthermore be made for a first gas outlet surface formed by the shield plate, which bounds the process chamber, to extend in a plane. Provision can furthermore be made for the shield plate to have a material thickness of 3 to 10 mm. Provision can be made for the structures locally influencing the heat flow through the shield plate to be designed as zones of different material thicknesses of the shield plate, wherein the average material thickness of the shield plate can lie in the range between 5 mm and 7.5 mm. Provision can be made for the structures to be depressions or elevations with respect to a mean, maximum, or minimum, material thickness, wherein provision can preferably be made for the elevations to be formed by zones with a material thickness that deviates by a maximum of 1 mm from the minimum or maximum material thickness, or for the depressions to be formed by zones in which the material thickness deviates by a maximum of 1 mm from a maximum, or mean, material thickness. Provision can furthermore be made for the zones locally influencing the heat flow through the shield plate to have differing surface properties from one another, wherein, in particular, provision is made for the surfaces to have differing thermal emissivities. Provision is also made for these zones to have different thermal conductivities, for example for the material property of the shield plate to vary locally. The zones of mutually differing heat flows through the shield plate can be locally assigned to the zones on which substrates to be coated on the susceptor are located. In the case of a rotatable susceptor, the zones can be arranged in an annulus around the center of rotation. In a preferred design of the invention, however, provision is made for the shield plate to have a material thickness that decreases towards the edge, only in the edge region, for purposes of influencing the lateral temperature profile. Thus, in accordance with the invention, the shield plate has a taper at the edge. The edge-side taper is preferably formed by a wedge-shaped section in the edge region, wherein the shield plate, which preferably has a substantially circular cross-section, has a planar gas outlet surface. The first gas passage openings of the shield plate can be aligned with the second gas passage openings of the ceiling panel. However, provision is also made for the first gas passage openings to be at least partially offset from the second gas passage openings.

The method executed in the above-described device preferably takes the form of a method for the deposition of semiconductor layers on semiconductor substrates. Sapphire substrates, silicon substrates, and also III-V substrates, can be used as substrates. The process gases introduced into the process chamber through the gas inlet member preferably contain hydrides of elements of the V-main group, and organometallic compounds of elements of the III-main group. At least one GaN layer is preferably deposited in the device.

The invention furthermore relates to a shield plate provided with local structures for use in such a device, or in such a method.

The maximum depth of the depression, or the maximum height of the elevation, is measured with respect to a rear plane, and can be 0.3 to 1.2 mm. The rear plane is defined by the rear face of the shield plate. The central zone of the rear face preferably defines the rear plane. If the central zone possesses no elevations or depressions, but rather is planar, the rear plane is defined by the surface of the rear face in the central zone. If, on the other hand, the central zone of the rear face does possess depressions or elevations, the planar region of the rear face surrounding the depressions or elevations defines the rear plane. The rear plane can thus be defined by the largest region of the rear face extending in a single plane. The material thickness, that is to say the thickness of the shield plate, is defined by a distance between the gas outlet surface, extending in a plane, and the rear plane. The gas outlet surface preferably runs parallel to the rear plane, such that the depressions or elevations are local deviations from the otherwise constant material thickness of the shield plate. The radially outer edge of the shield plate forms an overflow edge, over which can flow process gas that is fed into the gap. The overflow edge is adjacent to an annular gap to a boundary element that is formed by a side wall, which can guide the gas flow passing through the annular gap into a gas outlet annulus.

BRIEF DESCRIPTION OF THE DRAWINGS

In what follows, example embodiments of the invention are explained with reference to the accompanying drawings. Here:

FIG. 1 shows schematically a CVD reactor 1, with a gas inlet member 2 and a susceptor 3 arranged therein, wherein a shield plate 10 is located between the gas inlet member 2 and the susceptor 3, which shield plate bounds a process chamber 11 in the upwards direction, FIG. 2 shows in an enlarged manner the detail II in FIG. 1, FIG. 3 shows in an enlarged manner the detail III in FIG. 2.

DETAILED DESCRIPTION

Figure 4:
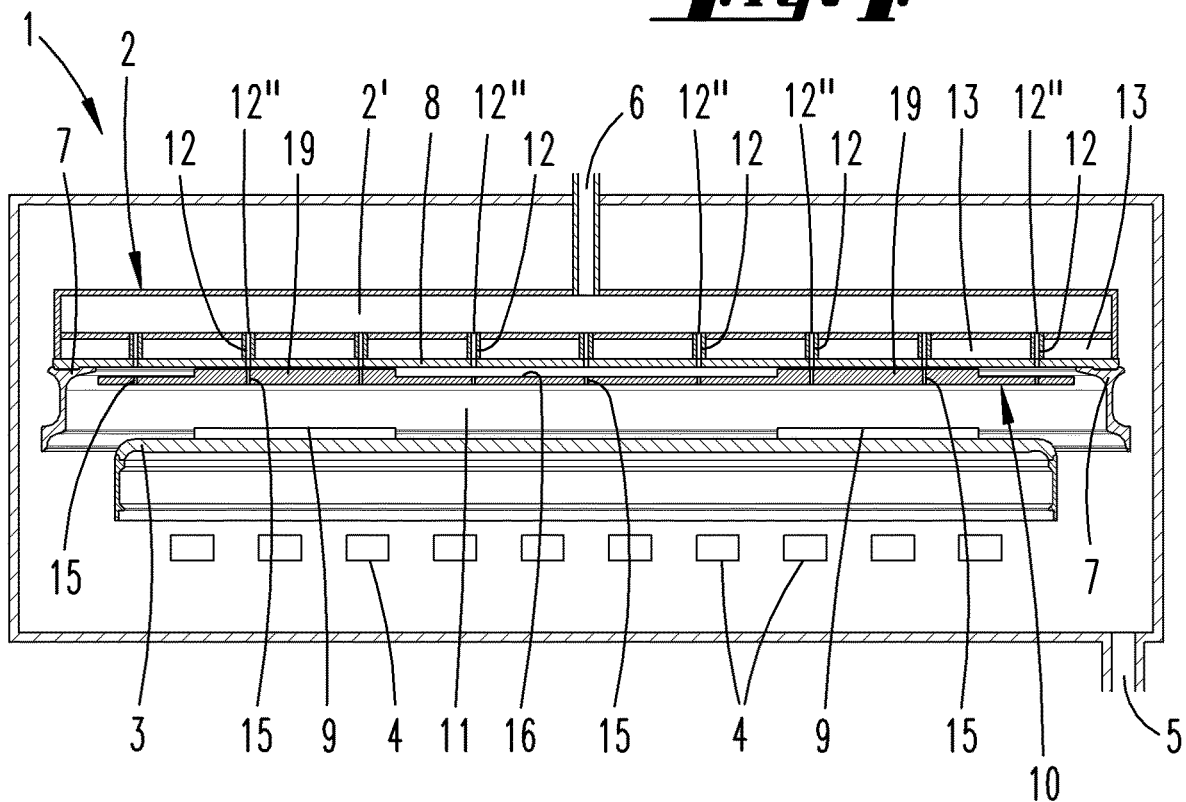
FIG. 4 shows a representation of the set-up of a CVD reactor 1 according to FIG. 1, but with a shield plate 10 of a second example of embodiment.

The CVD reactor 1 consists of a gas-tight and pressure-tight stainless-steel housing. Through a gas inlet 6, a process gas, transported in an inert gas, can be fed into a gas distribution chamber 2' of a gas inlet member 2. The gas inlet member 2 can also have a plurality of gas distribution chambers 2', such that different process gases can be fed into different gas distribution chambers 2'. In the example embodiment, only one gas distribution chamber 2' is illustrated, in the interest of simplicity. The process gas can exit from the gas distribution chamber 2' through a multiplicity of gas passageways 12 arranged in the manner of a showerhead. The gas passageways 12 possess two openings facing away from each other. One gas inlet opening 12" is adjacent to the gas distribution volume 2', and one gas outlet opening 12' is adjacent to a gas outlet surface 8' of a ceiling panel 8 of the gas inlet member 2.

The ceiling panel 8 forms a gas outlet surface 8', into which the gas outlet openings 12' lead. On the side facing away from the gas outlet surface 8' is located a coolant accommodation chamber 13, through which a coolant, for example cooling water, can flow, in order to cool the gas outlet plate formed by the ceiling panel 8 to temperatures below 300° C., below 200° C., and in particular, to approx. 100° C. or less.

In the reactor housing 1 is located a heating device 4, which can be an RF heater, or an IR heater, or similar. In this heating device 4, a susceptor 3, consisting in particular of coated graphite, is heated to a susceptor temperature of, for example, more than 1,000° C. One or a plurality of substrates 9 to be coated with a thin layer are located on an upper face of the susceptor 3, facing towards the process chamber 11.

The process chamber 11 is bounded at the top by a shield plate 10 made, for example, of graphite, and in particular coated graphite. However, the shield plate 10 can also be made of a ceramic material, or quartz. The shield plate 10 has a circular outline. The susceptor 3 can have approximately the same size as the shield plate 10, and also preferably possesses a circular outline.

The shield plate 10 possesses a multiplicity of gas passage openings 15. An upwards-facing opening 15' of the gas passage channel 15 faces towards a gap 17 between the gas outlet surface 8' of the ceiling panel 8 and the shield plate 10. An opening 15', facing away from the latter, forms a gas outlet opening for the exit of the process gas transported by the inert gas into the process chamber 11, adjacent to a gas outlet surface 14. A rear face 16 of the shield plate 10 is thus spaced apart from the gas outlet surface 8' of the ceiling panel 8 by a gap height S.

Thus, a first gas outlet surface 14, extending in a plane, and a second gas outlet surface 8', also extending in a plane, are formed. The reference number 7 denotes an annular boundary element, which can also act as a flow guidance means, so as to guide the process gas fed into the process chamber over the edge of the susceptor 3 to a gas outlet 5, to which are connected a vacuum pump and a gas cleaning device (these are not illustrated).

The boundary element 7 can be attached to the gas inlet member 2.

In the first example embodiment illustrated in FIGS. 1 to 3, the rear face 16 of the shield plate 10 is planar, except for an edge region 18. In the central region, radially within the edge region 18, the shield plate 10 thus has a constant material thickness in the range between 5 mm and 7.5 mm. In this region, it is spaced apart from the ceiling panel 8 by the gap height S of about 0.5 mm.

In the edge region 18, the material thickness of the shield plate 10 tapers towards the radially outermost edge, forming a wedge-shaped annular slope. By this means the edge region 18 forms a depression and a zone with a different heat transport property through the shield plate 10. By this means the temperature of the edge of the shield plate 10 can be influenced, and in particular can be increased.

In the example embodiment illustrated in FIG. 4, the gas outlet surface 14 of the shield plate 10 also extends in a plane. The rear face 16 also extends essentially in a plane parallel thereto. However, the rear face 16 possesses zones 19 that are formed by local elevations. In the region of the local elevations 19, the shield plate 10 possesses a greater material thickness than in the region surrounding the elevations 19.

Figure 5:
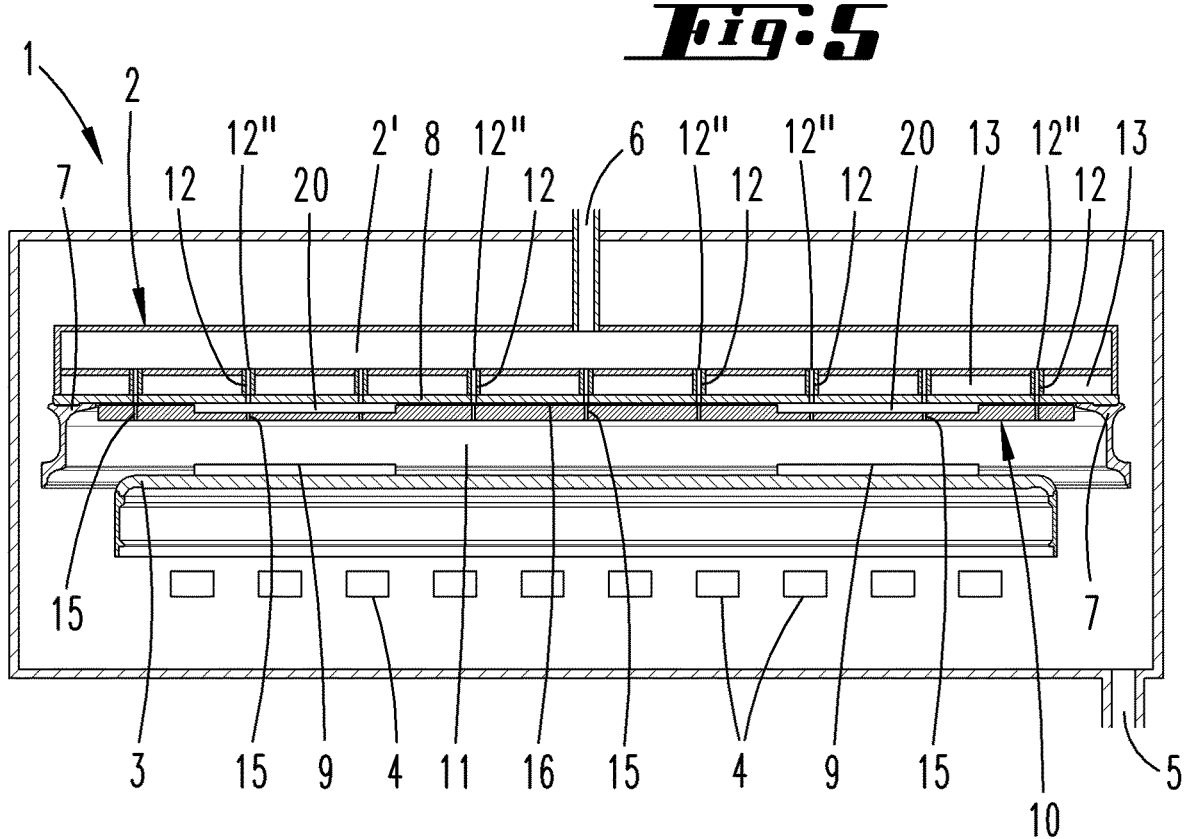
FIG. 5 shows a representation according to FIG. 4, with a shield plate 10 of a third example of embodiment.

In the example embodiment illustrated in FIG. 5, depressions 20 are provided, instead of the elevations 19 illustrated in FIG. 4. The depressions 20 in FIG. 5, or the elevations 19 in FIG. 4, can be circular.

The depressions 20, or elevations 19, in the example embodiments illustrated in FIGS. 4 and 5, are located at the sites where substrates 9 are arranged on the susceptor 3, below the shield plate 10.

In all example embodiments, the shield plate 10 preferably possesses gas passage openings 15 arranged in the manner of a screen or a showerhead, through which the process gas that has entered the gap 17 from the gas passage openings 12 can enter the process chamber 11.

In the example embodiment illustrated in FIGS. 1 to 3, the gas passageways 15 of the shield plate 10 are arranged offset from the gas passageways 12 of the gas inlet member 2. In the example embodiments illustrated in FIGS. 4 and 5, the gas passageways 15 are aligned with the gas passageways 12.

The material thickness d of the shield plate 10 can lie in the range from 3 to 12 mm. Preferably, the material thickness d can lie between 5 and 7.5 mm. The gap height S can lie in the range from 0.3 to 1 mm, preferably at 0.5 mm. The depth a of the depression can lie in the range between 0.46 mm and 0.9 mm. Accordingly, the dimension of the elevation can also lie in the range between 0.46 and 0.9 mm.

However, in accordance with one alternative embodiment, the dimension of the elevation or depression can also lie between 0.5 and 1.2 mm.

FIGS. 2 and 3 show with the reference symbol L an imaginary cylindrical shell surface extending around the circular susceptor 3. The diameter of the cylindrical shell surface L corresponds to the diameter of the susceptor 3, such that the process chamber 11 is surrounded by the shell surface L. The shield plate 10 forms an annular zone 18, in which the rear face 16 runs in an inclined manner. The annular zone 18 possesses a conical surface facing towards the ceiling panel 8, which extends over both a radially inner region F and also a radially outer region G. Between the two regions F and G extends the cylindrical shell surface L, such that the edge region of the shield plate, which is wedge-shaped in cross-section, is located both inside the process chamber 11, and also outside the process chamber 11. The radially inner region F extends vertically above the edge 3 of the susceptor. The radially outer-located region G extends vertically above a gas outlet channel surrounding the susceptor 3. At the outside edge of the shield plate, its thickness is reduced by 0.3 to 1.2 mm, or by 0.46 to 0.9 mm, compared to its thickness in the central region.

The rear face 16 extends in a central region, surrounded by the annular zone 18, in a plane that runs parallel to the gas outlet surface 14, and parallel to the gas outlet surface 8'. The gap 17 thus extends both over the central region and over the annular zone 18 of the shield plate 10, such that process gas emerging from the outlet openings 12' can also flow into the section of the gap 17 that extends over the annular zone 18.

In the region of the annular zone 18 that is wedge-shaped in cross-section are located gas passageways 15, such that process gas entering the gap 17 arranged above the annular zone 28 can enter the process chamber 11 through an outlet opening 15', which is assigned to the annular zone 18.

The above statements serve to explain the inventions recorded by the application as a whole, which in each case also autonomously advance the prior art, at least by means of the following combinations of features, wherein two, a plurality, or all, of these combinations of features can also be combined, namely:

A CVD reactor, which is characterized in that the shield plate 10 has a material thickness d in the range from 3 to 12 mm, defined by a distance between the gas outlet surface 14 and the rear face plane, and in that the shield plate 10 is spaced apart from a second gas outlet surface 8' formed by the ceiling panel) by a gap 17, defined by a distance between the second gas outlet surface 8' and the rear face plane, with a gap height S in a range from 0.3 to 1 mm.

A shield plate, which is characterized in that the shield plate 10 has a material thickness d, defined by a distance between the gas outlet surface 14 and the rear face plane, in the range from 3 to 12 mm, and in that the maximum depth of the depression, or the maximum height of the elevation, relative to the rear face plane, lies in the range between 0.46 and 0.9 mm, or lies between 0.5 and 1.2 mm.

A method, which is characterized in that the shield plate 10 has a material thickness d, defined by a distance between the gas outlet surface 14 and the rear face plane, in the range from 3 to 12 mm, and the rear face 16 of the shield plate 10 is spaced apart from the ceiling panel 8 by a gap 17 with a gap height S in the range from 0.3 to 1 mm.

A CVD reactor, or a shield plate, or a method, which is characterized in that the depression is formed by the annular zone 18, the surface of the rear face of which is a conical surface, such that the shield plate 10 in the annular zone possesses a material thickness that decreases in the form of a wedge towards the edge.

A CVD reactor, or a method, which is characterized in that the rear face 16 of the shield plate 10 is plane in the central zone, and has a distance with a constant gap height S from the second gas outlet surface 8' of the ceiling panel 8.

A CVD reactor, a shield plate, or a method, which is characterized in that at least one depression 18, 20, or elevation 19, is arranged in the central zone, spaced apart from the edge of the shield plate 10, or in that the depressions 18, 20, or elevations 19, are assigned to the central zone, and are spaced apart from the edge of the shield plate 10.

A CVD reactor, or a method, which is characterized in that the depressions 18, 20, or elevations 19, are local structures, which in each case extend vertically above a respective substrate 9.

A CVD reactor, or a method, which is characterized in that the outlet openings 12' of the ceiling panel 8 are aligned with gas passageways 15 of the shield plate 10, or are arranged offset from the gas passageways 15.

A CVD reactor, or a method, which is characterized in that a radially outermost edge of the susceptor 3 defines a boundary line L, and a radially inner region F of the annular zone 18, which is wedge-shaped in cross-section, extends radially inwards from the boundary line L, and a radially outer region G of the annular zone 18 extends radially outwards from the boundary line L.

A CVD reactor, or a method, which is characterized in that the radially inner region F and the radially outer region G have radial extents that differ from each other by a maximum of 50 percent, of 30 percent, of 20 percent, or of 10 percent.

A method, which is characterized in that process gas exiting through the gas outlet openings 12' is distributed in the gap 17 between the second gas outlet surface 8' and the rear face 16, and enters into a region of the gap extending above the annular zone 18, and enters into the process chamber 11 through at least one gas passage channel 15 arranged in the annular zone 18.

A CVD reactor, which is characterized in that the gap 17 between the second gas outlet surface 8' and the rear face 16 extends beyond the annular zone 18, such that process gas exiting through the gas outlet openings 12' is distributed in the gap, and can enter into the process chamber 11 through at least one gas passage channel 15 arranged in the annular zone 18.

A CVD reactor, or a method, which is characterized in that the ceiling panel 8 is immediately adjacent to a coolant accommodation chamber 13, through which pass gas passageways 12, leading into outlet openings 12'.

All disclosed features are essential to the invention (both individually, and also in combination with each other). The disclosure of the application hereby also includes the full disclosure content of the associated/attached priority documents (copy of the previous application), also for the purpose of including features of these documents in the claims of the present application. The subordinate claims, even without the features of a claim to which reference is made, with their features characterize autonomous inventive further developments of the prior art, in particular in order to file divisional applications on the basis of these claims. The invention specified in each claim can in addition have one or a plurality of the features specified in the above description, in particular those provided with reference symbols, and/or in the list of reference symbols. The invention also relates to forms of design in which individual features cited in the above description are not implemented, in particular to the extent that they are recognizably dispensable for the respective intended use, or can be replaced by other means having the same technical effect.

LIST OF REFERENCE SYMBOLS

1 CVD reactor
2 Gas inlet member
2' Gas distribution volume
3 Susceptor
4 Heating device
5 Gas outlet
6 Gas inlet
7 Boundary element
8 Ceiling panel
8' Gas outlet surface
9 Substrate
10 Shield plate
11 Process chamber
12 Gas passage channel
12' Outlet opening
12" Inlet opening
13 Coolant accommodation chamber
14 Gas outlet surface
15 Gas passage channel
15' Outlet opening
15" Inlet opening
16 Rear face
17 Gap
18 Edge region/depression/annular zone
19 Elevation
20 Depression S Gap height
a Depth
d Material thickness
L Boundary line
F Radially inner region
G Radially outer region

What is claimed is:

1. A chemical vapor deposition (CVD) reactor comprising:
   a process chamber (11);
   a gas inlet member (2) having a first circular outline, the gas inlet member (2) having a ceiling panel (8) facing towards the process chamber (11), wherein the ceiling panel (8) has outlet openings (12') and is cooled;
   a heating device (4);
   a susceptor (3) that is heated by the heating device (4), a radially outermost edge of the susceptor (3) defining a cylindrical shell surface boundary (L); and
   a shield plate (10), adjacent to the ceiling panel (8), having a second circular outline,
   wherein the shield plate (10) has a central zone, an annular zone (18) surrounding the central zone, a rear face (16) facing towards the ceiling panel (8), and a first gas outlet surface (14) facing towards the process chamber (11), into which gas outlet openings (15) of the shield plate (10) lead,
   wherein the first gas outlet surface (14) is planar,
   wherein the rear face (16) in the central zone defines a rear plane extending parallel to the first gas outlet surface (14),
   wherein the rear face (16) has structures (18, 19, 20) configured to influence (i) a thermal coupling of the shield plate (10) to the ceiling panel (8), and/or (ii) a heat flow through the shield plate (10),
   wherein the structures (18, 19, 20) form at least one elevation or one depression, with respect to the rear plane,
   wherein the shield plate (10) has a material thickness (d) that is defined by a distance between the first gas outlet surface (14) and the rear plane, with the material thickness (d) in a first range from 3 to 12 mm,
   wherein in the annular zone (18), the material thickness (d) of the shield plate (10) continuously decreases in a radial direction pointing away from a center of the shield plate (10),
   wherein the cylindrical shell surface boundary (L) intersects the annular zone (18) such that a radially inner region (F) of the annular zone (18) extends radially inwards from the cylindrical shell surface boundary (L) towards the center of the shield plate (10), and a radially outer region (G) of the annular zone (18) extends radially outwards from the cylindrical shell surface boundary (L) away from the center of the shield plate (10), and
   wherein the shield plate (10) is spaced apart from a second gas outlet surface (8') formed by the ceiling panel (8) by a gap (17), defined by a distance between the second gas outlet surface (8') and the rear plane, with a height (S) of the gap (17) in a second range from 0.3 to 1 mm.

2. The CVD reactor (1) of claim 1, wherein the at least one depression (18, 20) or elevation (19) spatially corresponds to a respective substrate (9) disposed on the susceptor (3) and in each case extends in a vertical direction above the respective substrate (9).

3. The CVD reactor (1) of claim 1, wherein the outlet openings (12') of the ceiling panel (8) are aligned with the gas outlet openings (15) of the shield plate (10), or are arranged offset from the gas outlet openings (15).

4. The CVD reactor (1) of claim 1, wherein the gas outlet openings (15) of the shield plate (10) are restricted in an area of the shield plate (10) radially inside of the boundary line (L).

5. The CVD reactor (1) of claim 4, wherein the radially inner region (F) and the radially outer region (G) have respective radial extents that differ from each other by a maximum of 50 percent.

6. The CVD reactor (1) of claim 1, wherein the gap (17) extends beyond the annular zone (18), such that process gas exiting through the outlet openings (12') is distributed in the gap (17), and enters into the process chamber (11) through at least one gas passage channel (15) arranged in the annular zone (18).

* * * * *